(12) United States Patent
Chen et al.

(10) Patent No.: US 12,414,292 B2
(45) Date of Patent: Sep. 9, 2025

(54) METHOD FOR MANUFACTURING MEMORY DEVICE HAVING WORD LINE WITH DUAL CONDUCTIVE MATERIALS

(71) Applicant: NANYA TECHNOLOGY CORPORATION, New Taipei (TW)

(72) Inventors: Yu-Ping Chen, New Taipei (TW); Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 566 days.

(21) Appl. No.: 17/696,058

(22) Filed: Mar. 16, 2022

(65) Prior Publication Data

US 2023/0301072 A1 Sep. 21, 2023

(51) Int. Cl.
*H10B 12/00* (2023.01)
*H10D 64/01* (2025.01)
*H10D 64/27* (2025.01)

(52) U.S. Cl.
CPC ......... *H10B 12/488* (2023.02); *H10B 12/053* (2023.02); *H10D 64/01* (2025.01); *H10D 64/513* (2025.01); *H10D 64/518* (2025.01)

(58) Field of Classification Search
USPC ........................................................ 438/239
See application file for complete search history.

(56) References Cited

U.S. PATENT DOCUMENTS

2007/0262415 A1* 11/2007 Smith ............... H01L 21/76879
257/530
2007/0264771 A1 11/2007 Ananthan et al.
2011/0180868 A1 7/2011 Jang
2012/0012927 A1* 1/2012 Uchiyama ............ H10B 12/482
257/330
2017/0365608 A1 12/2017 Lee et al.
2019/0165122 A1* 5/2019 Moon .................. H10D 64/027
2020/0176451 A1* 6/2020 Kang ..................... H10B 12/34
2020/0395455 A1 12/2020 Kim
(Continued)

FOREIGN PATENT DOCUMENTS

TW 201545352 A 12/2015
TW 202036847 A 10/2020
TW 202131499 A 8/2021

*Primary Examiner* — Eva Y Montalvo
*Assistant Examiner* — Jiyoung Oh
(74) *Attorney, Agent, or Firm* — MUNCY, GEISSLER, OLDS & LOWE, P.C.

(57) ABSTRACT

The present application provides a method for manufacturing a memory device having a word line (WL) with dual conductive materials. The method includes steps of providing a semiconductor substrate with an active area defined adjacent to a surface of the semiconductor substrate; forming a recess extending from the surface into the semiconductor substrate; disposing a first insulating layer conformal to the recess; disposing a first conductive material within the recess and surrounded by the first insulating layer; removing a portion of the first conductive material to form a first conductive member; disposing a second insulating layer within the recess and conformal to the first insulating layer and the first conductive member; and disposing a second conductive material within the recess and surrounded by the second insulating layer to form a second conductive member adjacent to the first conductive member.

16 Claims, 20 Drawing Sheets

(56) References Cited

U.S. PATENT DOCUMENTS

2021/0343720 A1    11/2021  Ping et al.
2022/0028894 A1*   1/2022   Yang .................. H10D 30/6755
2022/0077154 A1*   3/2022   Kim ..................... H10B 12/315

* cited by examiner

METHOD FOR MANUFACTURING MEMORY DEVICE HAVING WORD LINE WITH DUAL CONDUCTIVE MATERIALS

TECHNICAL FIELD

The present disclosure relates to a method for manufacturing a memory device, and more particularly, to a method for manufacturing a memory device having a word line (WL) with dual conductive materials.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a cell transistor is reduced to a few nanometers in length, current leakage may occur. The leakage may result in a significant drop in performance of the cell transistors. It is therefore desirable to develop improvements that address related manufacturing challenges.

SUMMARY

One aspect of the present disclosure provides a memory device. The memory device includes a semiconductor substrate with an active area defined adjacent to a surface of the semiconductor substrate, wherein the semiconductor substrate includes a recess extending from the surface into the semiconductor substrate; and a word line disposed within the recess, wherein the word line includes a first insulating layer disposed within and conformal to the recess, a first conductive member surrounded by the first insulating layer and disposed within the recess, a second insulating layer disposed conformal to the first insulating layer and the first conductive member, and a second conductive member disposed adjacent to the first conductive member and surrounded by the second insulating layer.

In some embodiments, a first work function of the first conductive member is substantially different from a second work function of the second conductive member.

In some embodiments, the first work function of the first conductive member is substantially greater than the second work function of the second conductive member.

In some embodiments, the first conductive member and the second conductive member include a same material.

In some embodiments, the first conductive member and the second conductive member include tungsten (W) or titanium nitride (TiN).

In some embodiments, the first insulating layer and the second insulating layer include oxide.

In some embodiments, the first conductive member is enclosed by the first insulating layer and the second insulating layer.

In some embodiments, the first conductive member is separated from the second conductive member by the second insulating layer.

In some embodiments, a top surface of the first conductive member is substantially lower than a top surface of the second conductive member.

In some embodiments, the top surface of the first conductive member and the top surface of the second conductive member are surrounded by the active area of the semiconductor substrate.

In some embodiments, a width of the top surface of the first conductive member is substantially greater than or equal to a width of the top surface of the second conductive member.

In some embodiments, the memory device further comprises a dielectric layer disposed over the first conductive member, the second conductive member and the second insulating layer.

In some embodiments, the dielectric layer is in contact with a top surface of the second conductive member.

In some embodiments, the memory device further comprises a conductive plug extending through the dielectric layer and connecting to the active area of the semiconductor substrate.

In some embodiments, at least a portion of the second insulating layer is disposed between the dielectric layer and a top surface of the first conductive member.

In some embodiments, the dielectric layer includes nitride.

In some embodiments, a height of the first conductive member is substantially less than or equal to a height of the second conductive member.

Another aspect of the present disclosure provides a memory device. The memory device includes a semiconductor substrate with an active area defined adjacent to a surface of the semiconductor substrate, wherein the semiconductor substrate includes a first recess extending from the surface into the semiconductor substrate; and a word line disposed within the first recess, wherein the word line includes a first insulating layer disposed conformal to the first recess and having a second recess within the first recess, a first conductive member surrounded by the first insulating layer and disposed within the second recess, a second insulating layer disposed conformal to the second recess and the first conductive member and having a third recess within the second recess, and a second conductive member disposed within the third recess.

In some embodiments, the third recess has a first width at a position adjacent to the first conductive member and a second width at a position above the first conductive member and above the position having the first width.

In some embodiments, the second width is substantially different from the first width.

In some embodiments, the second width is substantially greater than the first width.

In some embodiments, a first work function of the first conductive member is substantially greater than a second work function of the second conductive member.

In some embodiments, the first work function of the first conductive member is substantially greater than 4 eV, and the second work function of the second conductive member is substantially less than 4 eV.

In some embodiments, a difference between the first work function and the second work function is substantially greater than 0.5 eV.

Another aspect of the present disclosure provides a method of manufacturing a memory device. The method includes steps of providing a semiconductor substrate with an active area defined adjacent to a surface of the semiconductor substrate; forming a recess extending from the surface into the semiconductor substrate; disposing a first insulating layer conformal to the recess; disposing a first conductive material within the recess and surrounded by the first insulating layer; removing a portion of the first conductive material to form a first conductive member; disposing a second insulating layer within the recess and conformal to the first insulating layer and the first conductive member; and disposing a second conductive material within the recess and surrounded by the second insulating layer to form a second conductive member adjacent to the first conductive member.

In some embodiments, a first work function of the first conductive material is substantially different from a second work function of the second conductive material.

In some embodiments, the first work function of the first conductive material is substantially greater than the second work function of the second conductive member.

In some embodiments, the first conductive material is same as the second conductive material.

In some embodiments, the method further comprises disposing a patterned photoresist over the first insulating layer and the first conductive material, wherein the portion of the first conductive material exposed through the patterned photoresist is removed.

In some embodiments, the method further comprises removing the patterned photoresist after the formation of the first conductive member.

In some embodiments, a portion of the second conductive material disposed above the first conductive member is removed to form the second conductive member.

In some embodiments, the method further comprises disposing a dielectric layer over the first conductive member, the second conductive member and the second insulating layer; and forming a conductive plug extending through the dielectric layer and connecting to the active area of the semiconductor substrate.

In some embodiments, the disposing of the second insulating layer is performed prior to the disposing of the second conductive material.

In some embodiments, the disposing of the first conductive material is performed prior to the disposing of the second conductive material.

In some embodiments, the disposing of the first conductive material and the disposing of the second conductive material are performed separately.

In conclusion, because a word line includes dual conductive materials having different work functions, such difference can suppress or prevent a gate-induced drain leakage (GIDL). More specifically, because the word line includes a first conductive material with a high work function and a second conductive material with a low work function, such configuration can reduce the GIDL issue. Therefore, performance of the memory device and a process of manufacturing the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
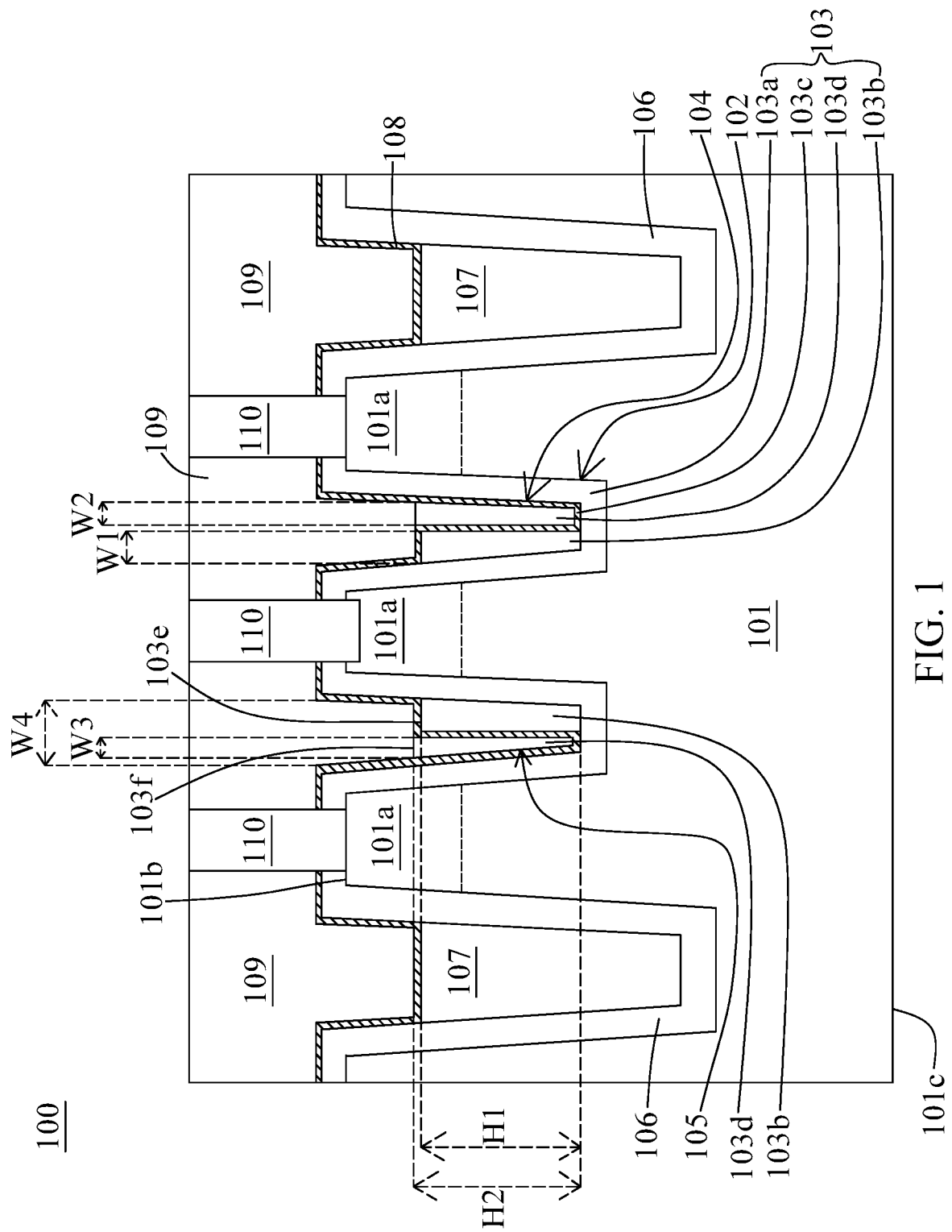
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a memory device 100 in accordance with some embodiments of the present disclosure. In some embodiments, the memory device 100 includes several unit cells arranged in rows and columns.

In some embodiments, the memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes several active areas (AA) 101a. The active area 101a is a doped region in the semiconductor substrate 101. In some embodiments, the active area 101a extends horizontally over or under a top surface of the semiconductor substrate 101. In some embodiments, the active area 101a is disposed adjacent to the top surface of the semiconductor substrate 101. In some embodiments, each of the active areas 101a includes a same type of dopant. In some embodiments, each of the active areas 101a includes a type of dopant that is different from types of dopants included in other active areas 101a. In some embodiments, each of the active areas 101a has a same conductive type. In some embodiments, the active area 101a includes n-type dopants.

In some embodiments, the semiconductor substrate 101 includes a first surface 101b and a second surface 101c opposite to the first surface 101b. In some embodiments, the first surface 101b is a front side of the semiconductor substrate 101, wherein electrical devices or components are subsequently formed over the first surface 101b and configured to electrically connect to an external circuitry. In some embodiments, the active area 101a is adjacent to or under the first surface 101b. In some embodiments, the second surface 101c is a back side of the semiconductor substrate 101, where electrical devices or components are absent.

In some embodiments, the semiconductor substrate 101 includes a recess 102 extending into the semiconductor substrate 101. In some embodiments, the recess 102 extends from the first surface 101b toward the second surface 101c of the semiconductor substrate 101. In some embodiments, the recess 102 is tapered from the first surface 101b toward the second surface 101c of the semiconductor substrate 101. In some embodiments, a depth of the recess 102 is substantially greater than a depth of the active area 101a.

In some embodiments, the memory device 100 includes a word line 103 disposed within the recess 102. In some embodiments, the word line 103 includes a first insulating layer 103a, a first conductive member 103b, a second insulating layer 103c and a second conductive member 103d.

In some embodiments, the first insulating layer 103a is disposed within and conformal to the recess 102. In some embodiments, at least a portion of the first insulating layer 103a is surrounded by the active area 101a. In some embodiments, the first insulating layer 103a covers an entire sidewall of the recess 102. In some embodiments, a portion of the first insulating layer 103a is disposed over the first surface 101b of the semiconductor substrate 101. In some embodiments, the first insulating layer 103a has a second recess 104 disposed within the recess 102.

In some embodiments, the first insulating layer 103a includes dielectric material such as oxide. In some embodiments, the first insulating layer 103a is formed of an insulating material, such as silicon oxide, silicon nitride, silicon oxynitride, the like, or a combination thereof. In some embodiments, the first insulating layer 103a includes dielectric material with a low dielectric constant (low k).

In some embodiments, the first conductive member 103b is surrounded by the first insulating layer 103a and disposed within the recess 102. In some embodiments, the first conductive member 103b extends within the first insulating layer 103a from the first surface 101b toward the second surface 101c of the semiconductor substrate 101. In some embodiments, the first conductive member 103b is disposed along a sidewall of the first insulating layer 103a. In some embodiments, the first conductive member 103b is disposed within the second recess 104.

In some embodiments, the first conductive member 103b includes a first conductive material with a first work function. In some embodiments, the first work function of the first conductive member 103b is substantially greater than 4 eV. In some embodiments, the first work function of the first conductive member 103b is in a range of about 1 eV to about 8 eV. In some embodiments, the first conductive member 103b includes conductive material such as titanium nitride (TiN), tungsten (W) or the like.

In some embodiments, the second insulating layer 103c is disposed conformal to the first insulating layer 103a and the first conductive member 103b. In some embodiments, the second insulating layer 103c is disposed conformal to a portion of the second recess 104. In some embodiments, at least a portion of the second insulating layer 103c is surrounded by the active area 101a. In some embodiments, the second insulating layer 103c and the first insulating layer 103a enclose the first conductive member 103b. In some embodiments, the second insulating layer 103c covers the first conductive member 103b.

In some embodiments, the second insulating layer 103c is disposed along a portion of a sidewall of the first insulating layer 103a, a portion of a bottom surface of the first insulating layer 103a, a portion of a sidewall of the first conductive member 103b and a top surface 103e of the first conductive member 103b. In some embodiments, a portion of the second insulating layer 103c is disposed over the first surface 101b of the semiconductor substrate 101.

In some embodiments, the second insulating layer 103c has a third recess 105 disposed within the second recess 104. In some embodiments, the third recess 105 has a first width W3 at a position adjacent to the first conductive member 103b and a second width W4 at a position above the first conductive member 103b and above the position having the first width W3. In some embodiments, the second width W4 is substantially different from the first width W3. In some embodiments, the second width W4 is substantially greater than the first width W3.

In some embodiments, the second insulating layer 103c includes a material different from a material of the first insulating layer 103a. In some embodiments, the second insulating layer 103c includes a same material as the first insulating layer 103a. In some embodiments, the second insulating layer 103c includes dielectric material such as oxide. In some embodiments, the second insulating layer 103c is formed of an insulating material, such as silicon oxide, silicon nitride, silicon oxynitride, the like, or a combination thereof. In some embodiments, the second insulating layer 103c includes dielectric material with a low dielectric constant (low k).

In some embodiments, the second conductive member 103d is disposed adjacent to the first conductive member 103b and surrounded by the second insulating layer 103c. In some embodiments, the second conductive member 103d extends within the second insulating layer 103c from the first surface 101b toward the second surface 101c of the semiconductor substrate 101.

In some embodiments, the second conductive member 103d extends substantially parallel to the first conductive member 103b. The second conductive member 103d is separated from the first conductive member 103b by the second insulating layer 103c. In some embodiments, the second conductive member 103d is disposed within the third recess 105. In some embodiments, the first conductive member 103b and the second conductive member 103d serve as a gate electrode.

In some embodiments, the top surface 103e of the first conductive member 103b is substantially lower than a top surface 103f of the second conductive member 103d. In some embodiments, the top surface 103e of the first conductive member 103b and the top surface 103f of the second conductive member 103d are surrounded by the active area 101a of the semiconductor substrate 101. In some embodiments, the top surface 103f of the second conductive member 103d is substantially coplanar with a horizontal surface of the second insulating layer 103c.

In some embodiments, a width W1 of the top surface 103e of the first conductive member 103b is substantially greater than or equal to a width W2 of the top surface 103f of the second conductive member 103d. In some embodiments, a height H1 of the first conductive member 103b is substantially less than or equal to a height H2 of the second conductive member 103d.

In some embodiments, the second conductive member 103d includes a second conductive material with a second work function. In some embodiments, the first work function of the first conductive member 103b is substantially different from the second work function of the second conductive member 103d. In some embodiments, the first work function of the first conductive member 103b is substantially greater than the second work function of the second conductive member 103d.

In some embodiments, the second work function of the second conductive member 103d is substantially less than 4 eV. In some embodiments, the second work function of the second conductive member 103d is in a range of about 0.1 eV to about 1 eV. In some embodiments, a difference between the first work function of the first conductive member 103b and the second work function of the second conductive member 103d is substantially greater than 0.5 eV. In some embodiments, the second conductive member 103d includes conductive material such as titanium nitride (TiN), tungsten (W) or the like. In some embodiments, the second conductive member 103d includes a material same as a material of the first conductive member 103b.

In some embodiments, the memory device 100 further includes an isolation structure 106 adjacent to the word line 103. In some embodiments, the isolation structure 106 extends into the semiconductor substrate 101 from the first surface 101b toward the second surface 101c of the semiconductor substrate 101.

In some embodiments, the isolation structure 106 is a shallow trench isolation (STI). In some embodiments, the isolation structure 106 defines a boundary of the active area 101a. In some embodiments, the isolation structure 106 includes dielectric material such as oxide. In some embodiments, the isolation structure 106 is formed of an insulating material, such as silicon oxide, silicon nitride, silicon oxynitride, the like, or a combination thereof.

In some embodiments, a third conductive member 107 is surrounded by the isolation structure 106. In some embodiments, the third conductive member 107 has a third work function substantially equal to the first work function of the first conductive member 103b. In some embodiments, the third work function of the third conductive member 107 is substantially greater than 4 eV. In some embodiments, the third conductive member 107 includes conductive material such as titanium nitride (TiN), tungsten (W) or the like.

In some embodiments, a third insulating layer 108 is disposed over the third conductive member 107 and the isolation structure 106. In some embodiments, the third insulating layer 108 includes a material same as the material of the second insulating layer 103c. In some embodiments, the third insulating layer 108 includes dielectric material such as oxide. In some embodiments, the third insulating layer 108 is formed of an insulating material, such as silicon oxide, silicon nitride, silicon oxynitride, the like, or a combination thereof.

In some embodiments, the memory device 100 further includes a dielectric layer 109 disposed over the first conductive member 103b, the second conductive member 103d, the second insulating layer 103c, the third conductive member 107 and the third insulating layer 108. In some embodiments, the dielectric layer 109 is in contact with the second insulating layer 103c, the third insulating layer 108 and the top surface 103f of the second conductive member 103d.

In some embodiments, at least a portion of the second insulating layer 103c is disposed between the dielectric layer 109 and the top surface 103e of the first conductive member 103b. In some embodiments, the dielectric layer 109 includes dielectric material such as nitride. In some embodiments, the dielectric layer 109 serves as a gate dielectric.

In some embodiments, the memory device 100 further includes a conductive plug 110 extending through the dielectric layer 109 and connecting to the active area 101a of the semiconductor substrate 101. In some embodiments, the conductive plug 110 extends through the first insulating layer 103a and the second insulating layer 103c. In some embodiments, a portion of the conductive plug 110 protrudes into the semiconductor substrate 101 or the active area 101a of the semiconductor substrate 101, such that the portion of the conductive plug 110 is surrounded by the semiconductor substrate 101 or the active area 101a of the semiconductor substrate 101. In some embodiments, the conductive plug 110 includes conductive material such as metal. In some embodiments, the conductive plug 110 includes copper, gold, silver or the like.

Since the word line 103 includes dual conductive materials having different work functions, such difference can suppress or prevent a gate-induced drain leakage (GIDL). More specifically, because the word line 103 includes the first conductive member 103b with the high work function and the second conductive member 103d with the low work function, such configuration can reduce the GIDL issue. Therefore, performance of the memory device 100 can be improved.

Figure 2:
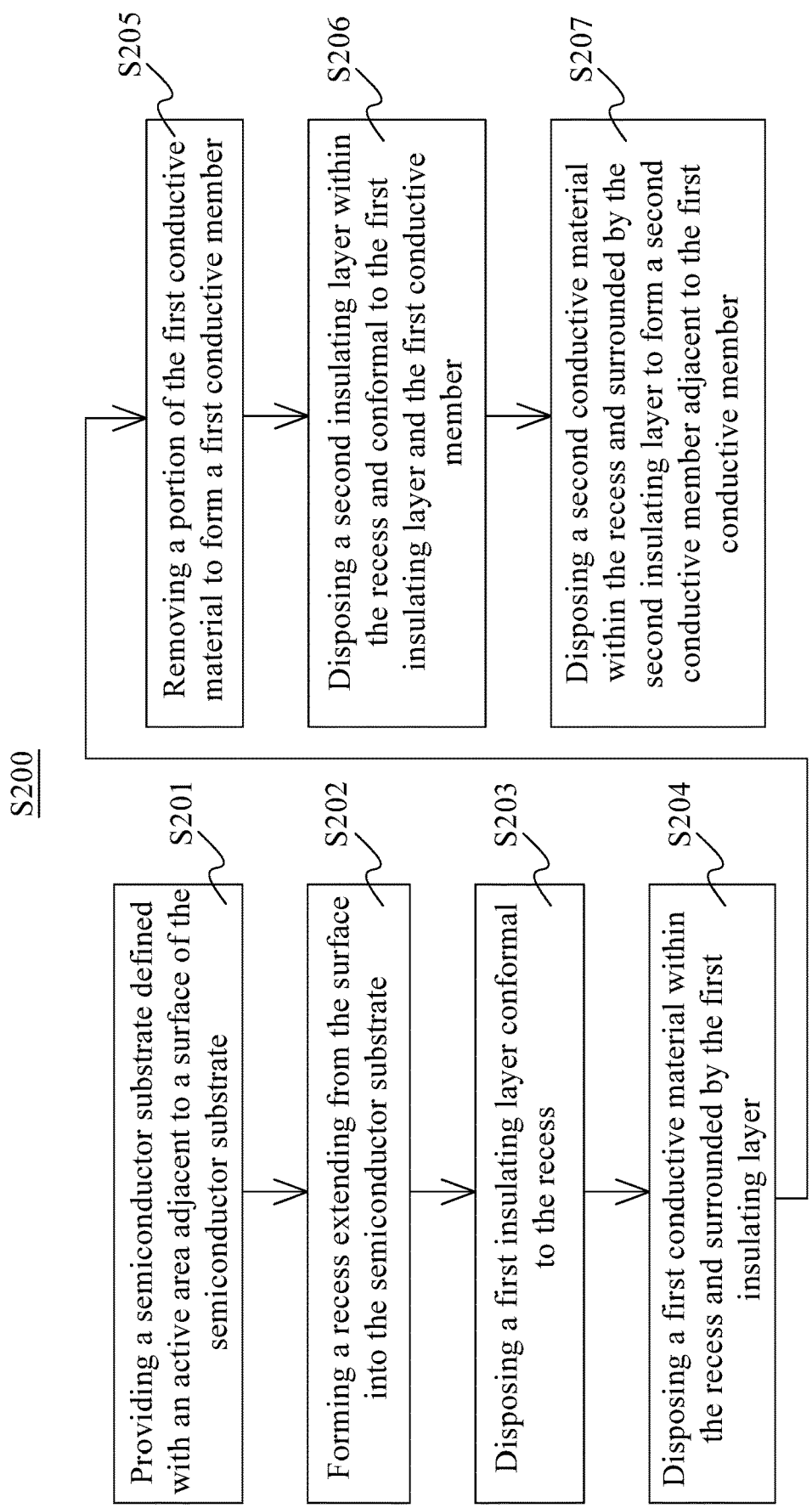
FIG. 2 is a flow diagram illustrating a method of manufacturing a memory device in accordance with some embodiments of the present disclosure.

FIG. 2 is a flow diagram illustrating a method S200 of manufacturing a memory device 100 in accordance with some embodiments of the present disclosure, and FIGS. 3 to 20 illustrate cross-sectional views of intermediate stages in formation of the memory device 100 in accordance with some embodiments of the present disclosure.

The stages shown in FIGS. 3 to 20 are also illustrated schematically in the flow diagram in FIG. 2. In following discussion, the fabrication stages shown in FIGS. 3 to 20 are discussed in reference to process steps shown in FIG. 2. The method S200 includes a number of operations, and description and illustration are not deemed as a limitation to a sequence of the operations. The method S200 includes a number of steps (S201, S202, S203, S204, S205, S206 and S207).

Figure 3:
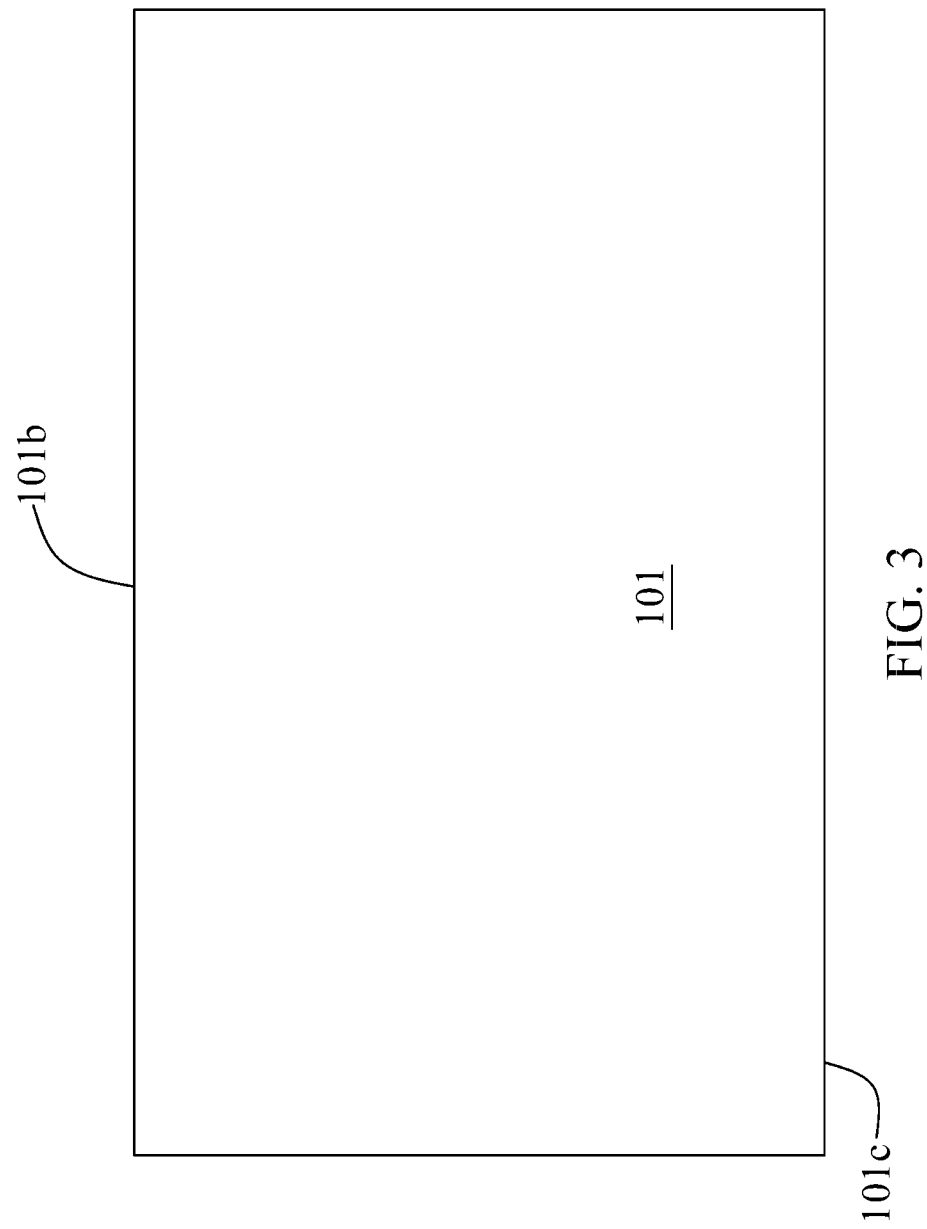
FIGS. 3 to 20 illustrate cross-sectional views of intermediate stages in the formation of a memory device in accordance with some embodiments of the present disclosure.
Figure 4:
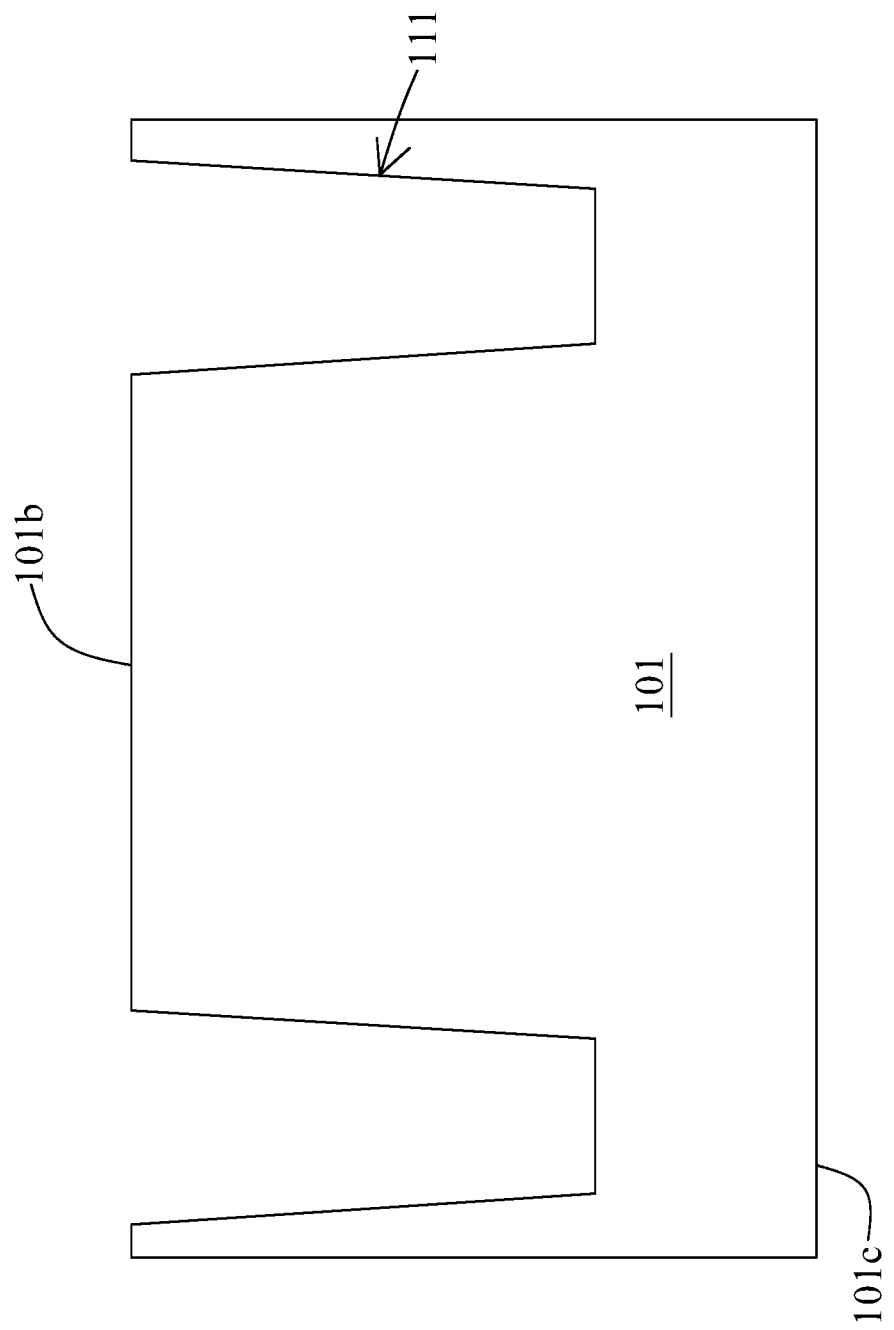
Figure 5:
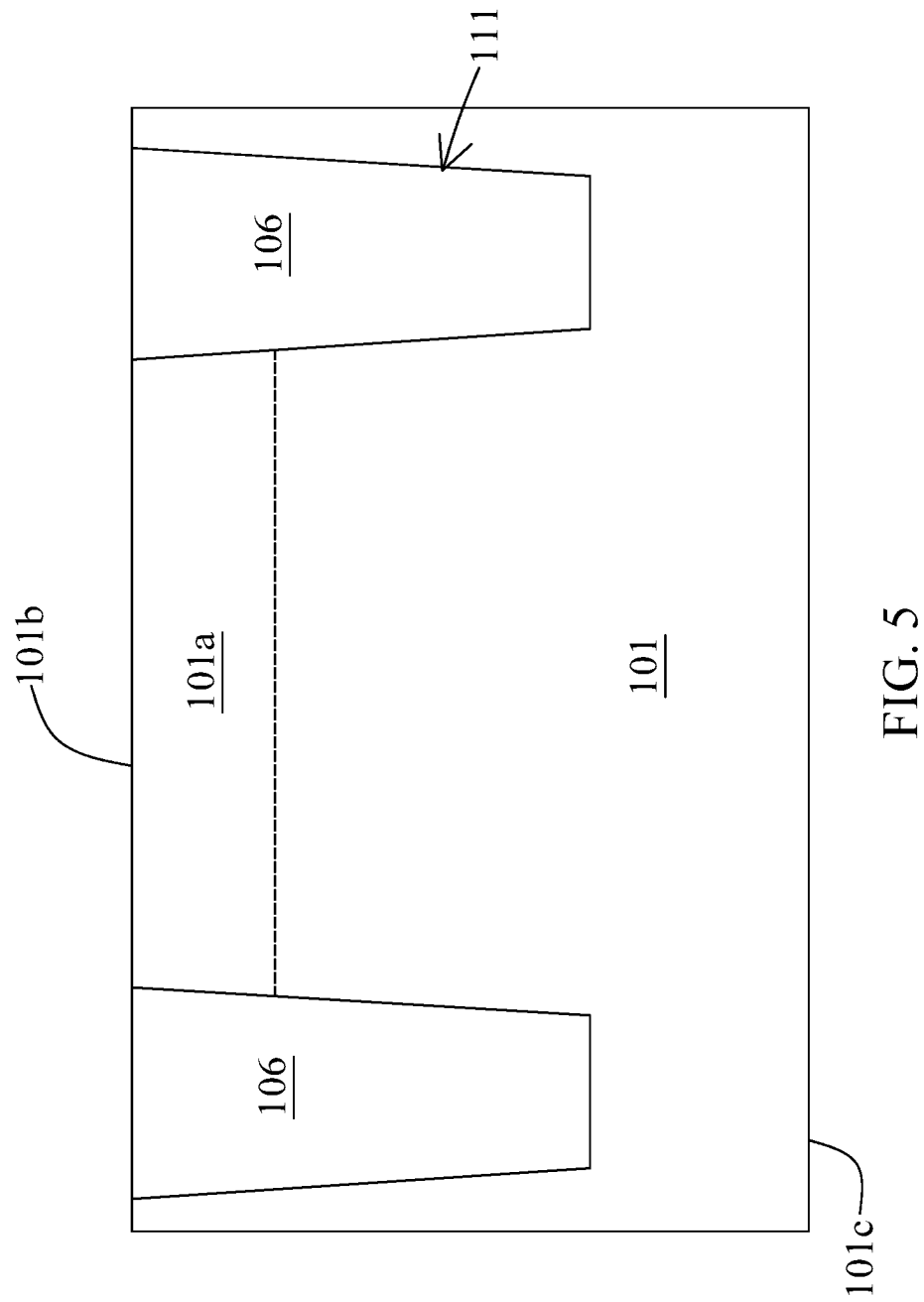

Referring to FIGS. 3 to 5, a semiconductor substrate 101 with an active area 101a defined adjacent to a first surface 101b of the semiconductor substrate 101 is provided according to step S201 in FIG. 2. In some embodiments, the semiconductor substrate 101 having the first surface 101b and a second surface 101c opposite to the first surface 101b is provided as shown in FIG. 3. In some embodiments, a trench 111 extending from the first surface 101b toward the second surface 101c is formed as shown in FIG. 4. The trench 111 is formed by removing some portions of the semiconductor substrate 101.

In some embodiments, the semiconductor substrate 101 includes an isolation structure 106 surrounding the active area 101a. In some embodiments, the isolation structure 106 extends from the first surface 101b toward the second surface 101c of the semiconductor substrate 101. In some embodiments, the isolation structure 106 includes dielectric material such as oxide or the like. In some embodiments, the isolation structure 106 is formed by disposing an isolation material into the trench 111 as shown in FIG. 5.

Figure 6:
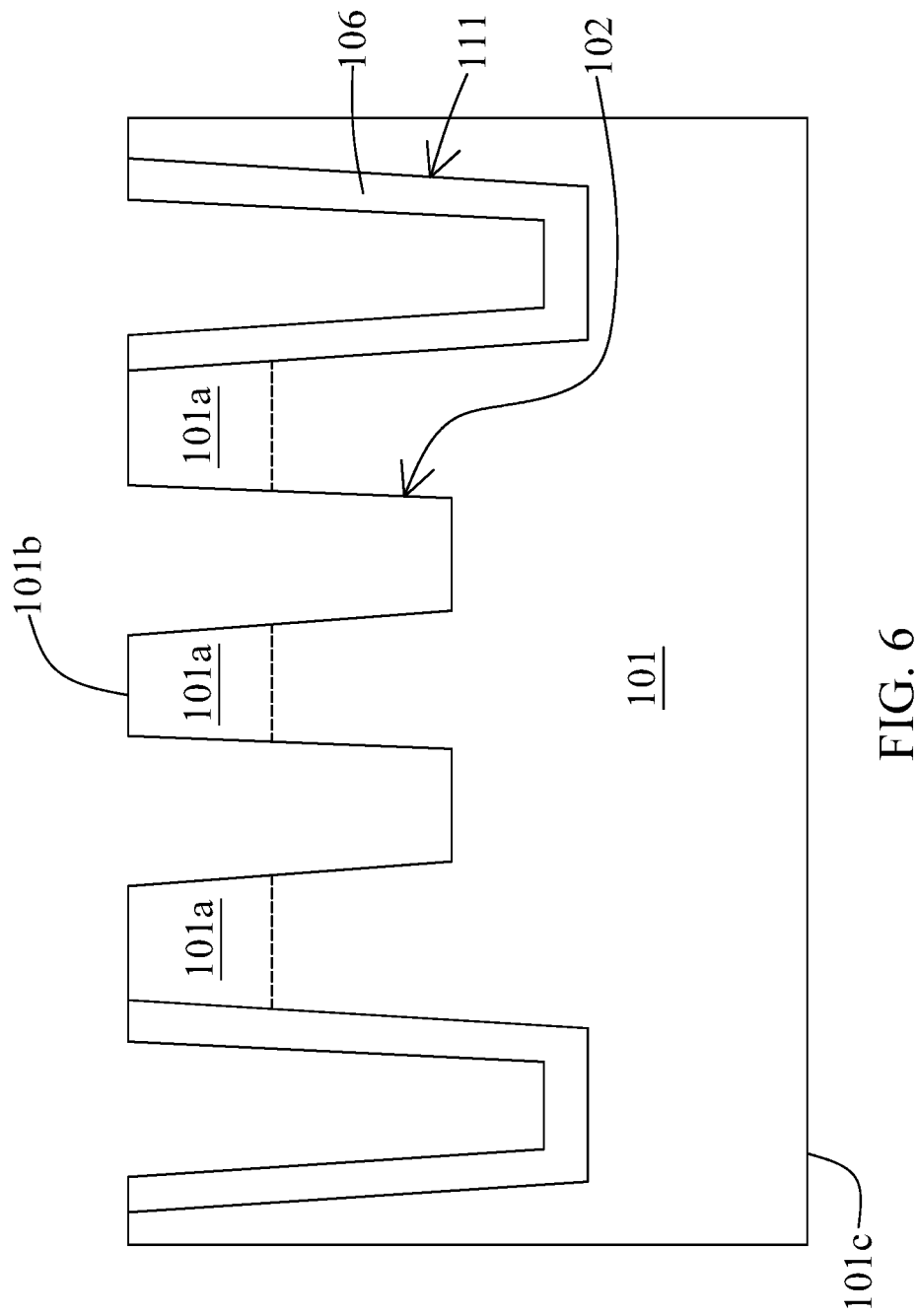

Referring to FIG. 6, a recess 102 extending from the first surface 101b into the semiconductor substrate 101 is formed according to step S202 in FIG. 2. In some embodiments, the recess 102 is formed by removing some portions of the semiconductor substrate 101. In some embodiments, the portions of the semiconductor substrate 101 are removed by etching or any other suitable process. In some embodiments, the recess 102 is at least partially surrounded by the active area 101a of the semiconductor substrate 101. In some embodiments, a portion of the isolation structure 106 is removed.

Figure 7:
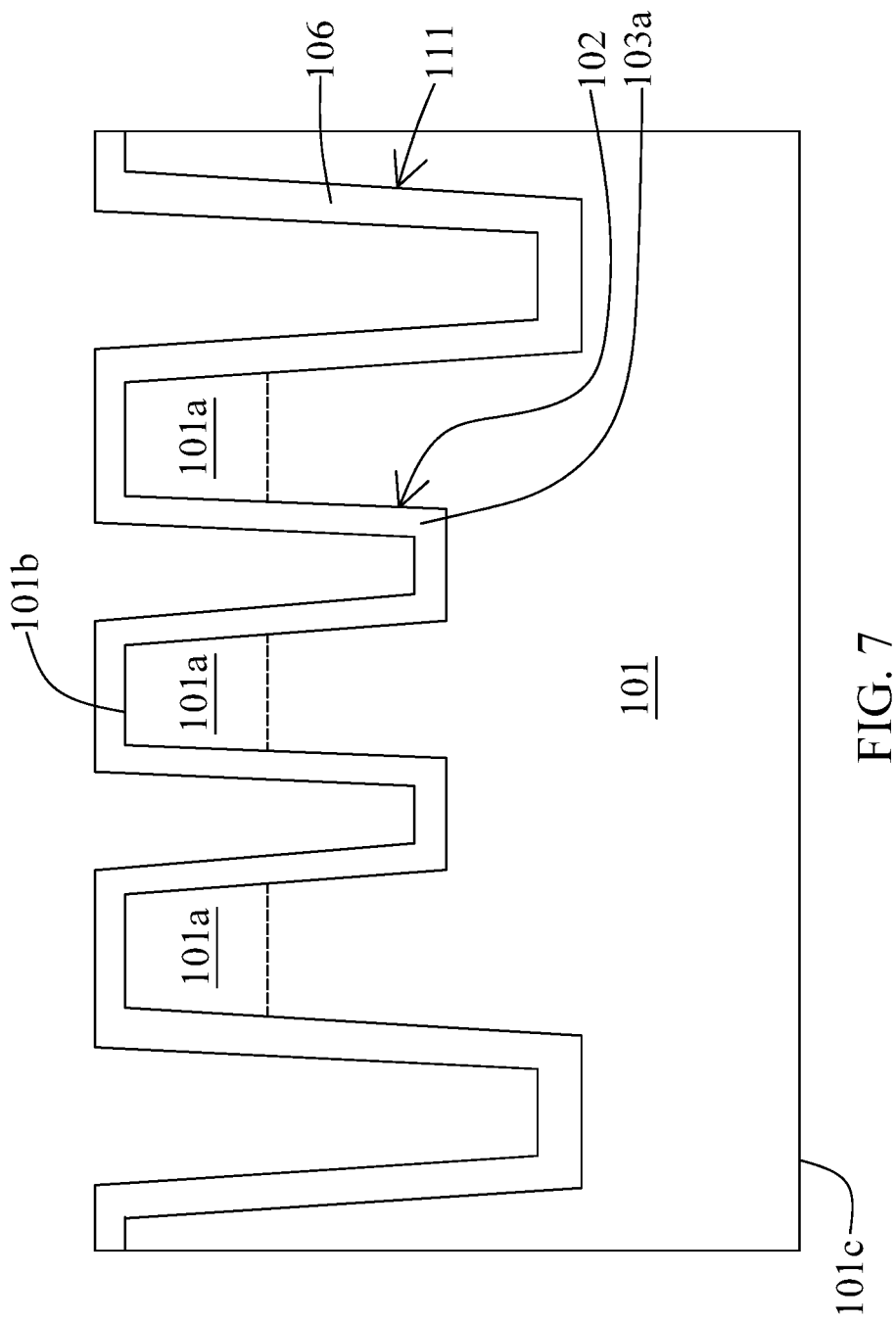

Referring to FIG. 7, a first insulating layer 103a conformal to the recess 102 is disposed according to step S203 in FIG. 2. In some embodiments, the first insulating layer 103a is disposed over the first surface 101b of the semiconductor substrate 101. In some embodiments, the first insulating layer 103a covers an entire sidewall of the recess 102. In some embodiments, the first insulating layer 103a includes dielectric material such as oxide. In some embodiments, the first insulating layer 103a and the isolation structure 106 include a same material. In some embodiments, the first insulating layer 103a is formed by deposition, oxidation or any other suitable process.

Figure 8:
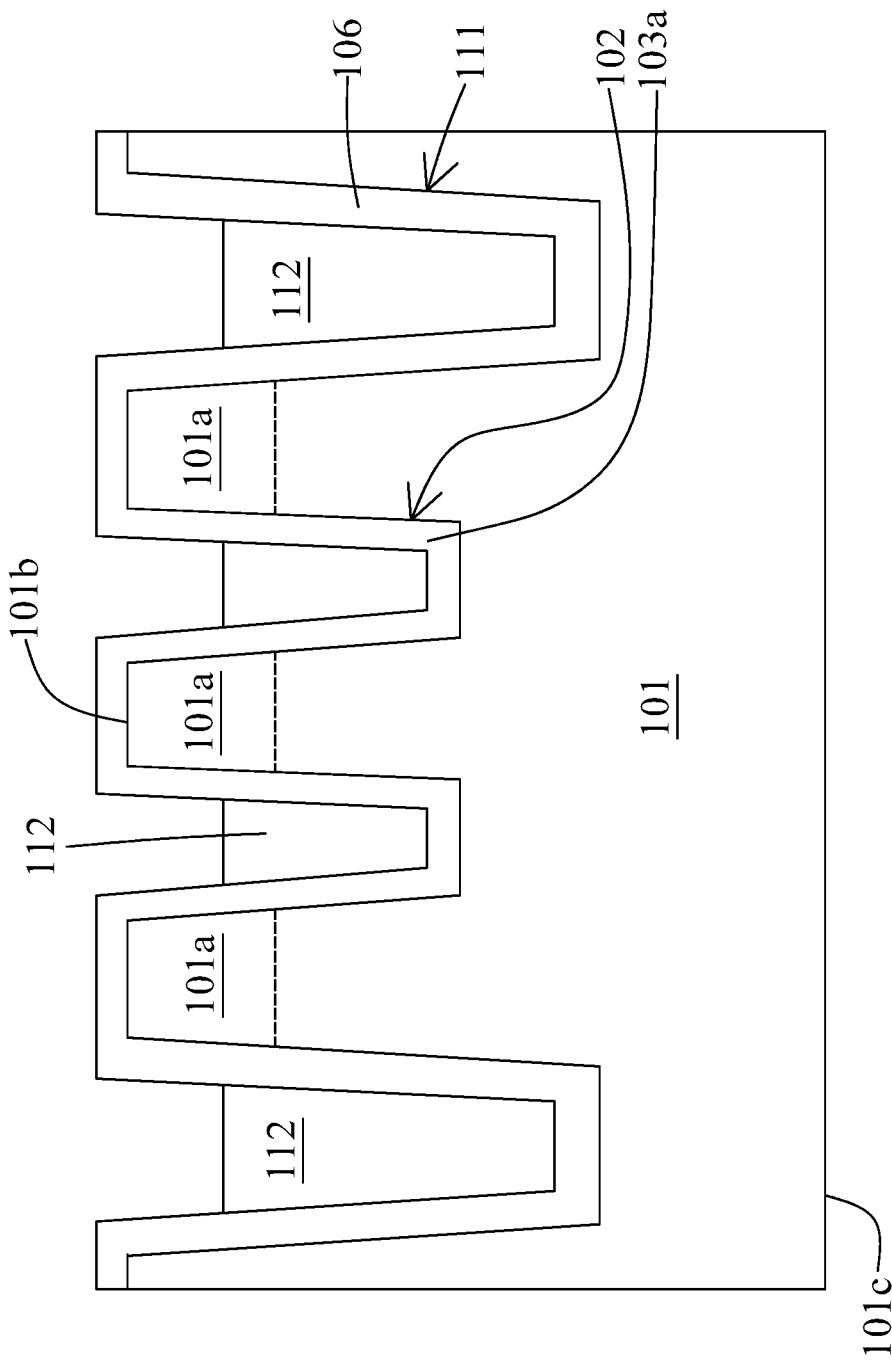

Referring to FIG. 8, a first conductive material 112 is disposed according to step S204 in FIG. 2. In some embodiments, the first conductive material 112 is disposed within the recess 102 and surrounded by the first insulating layer 103a. In some embodiments, the first conductive material 112 is also disposed within the trench 111 and surrounded by the isolation structure 106. In some embodiments, at least a portion of the first conductive material 112 is surrounded by the active area 101a of the semiconductor substrate 101. In some embodiments, the first conductive material 112 is disposed by deposition, chemical vapor deposition (CVD) or any other suitable process.

In some embodiments, the first conductive material 112 has a first work function substantially greater than 4 eV. In some embodiments, the first conductive material 112 is titanium nitride (TiN), tungsten (W) or the like.

Figure 9:
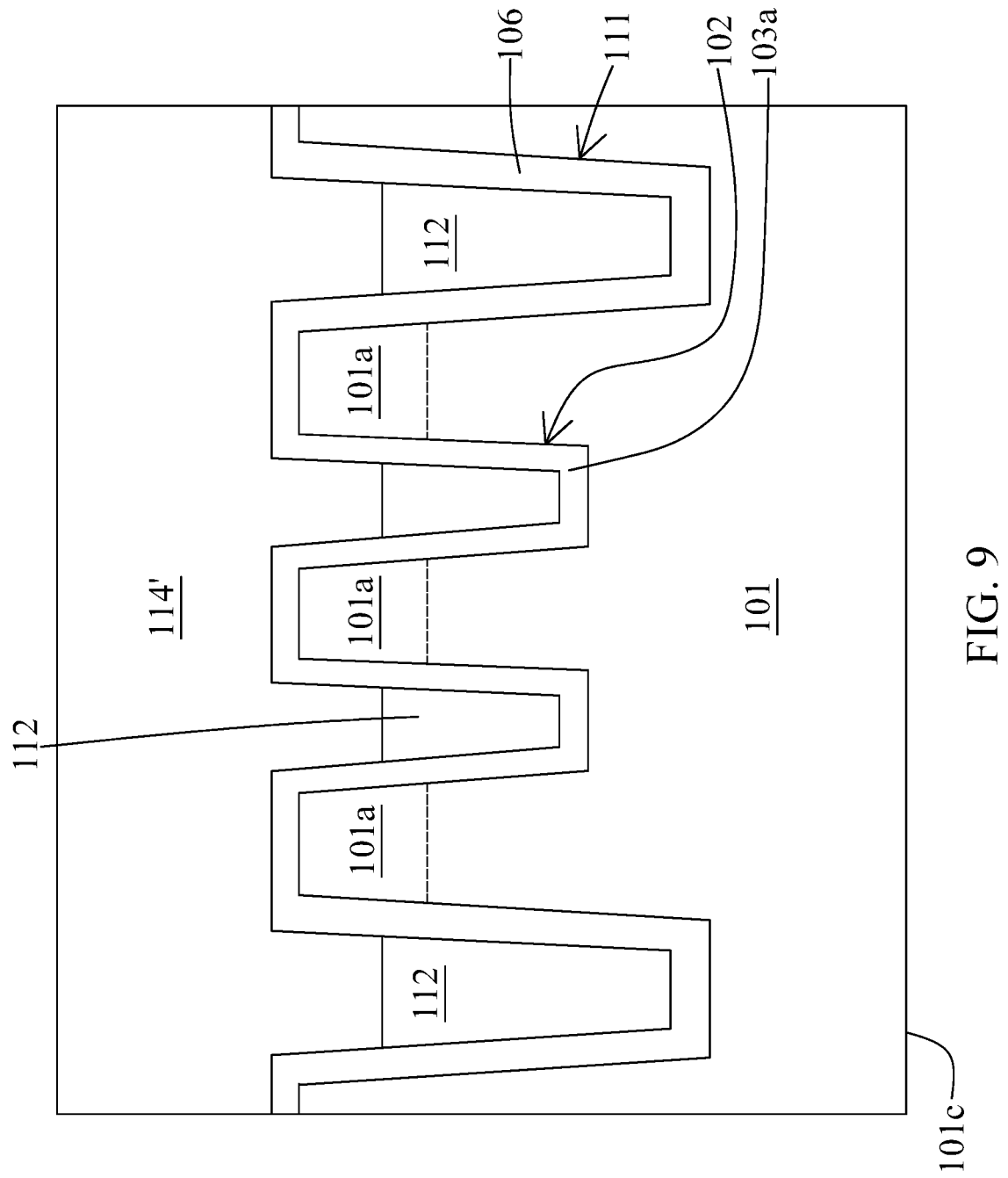

Referring to FIGS. 9 to 12, a portion of the first conductive material 112 is removed to form a first conductive member 103b according to step S205 in FIG. 2. In some embodiments, a photoresist 114' is disposed over the first conductive material 112, the first insulating layer 103a and the isolation structure 106 as shown in FIG. 9. In some embodiments, the photoresist 114' is disposed by spin coating or any other suitable process.

Figure 10:
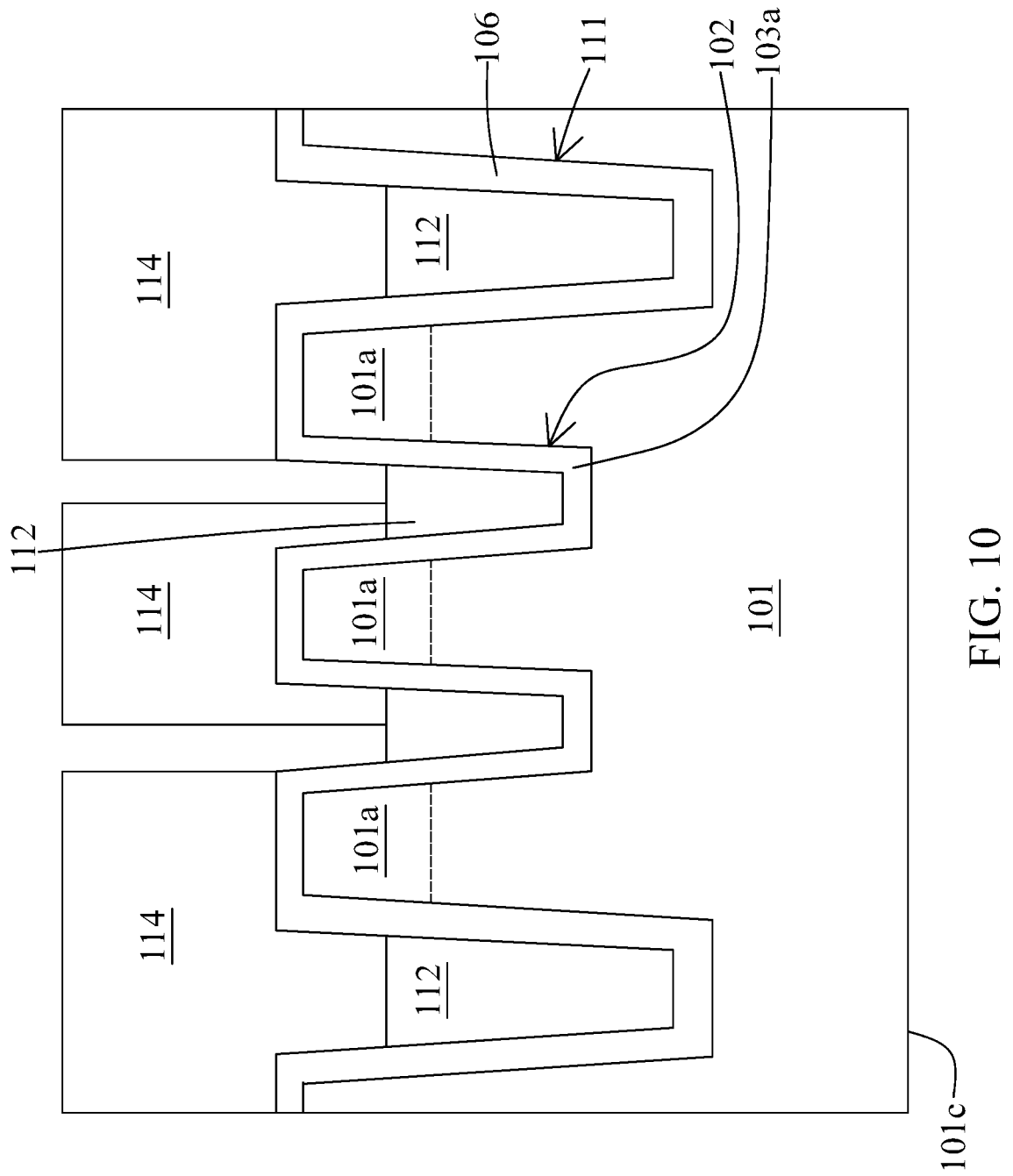

In some embodiments, after the disposing of the photoresist 114', a portion of the photoresist 114' is removed to form a patterned photoresist 114 as shown in FIG. 10. In some embodiments, a portion of the first conductive material 112 is exposed through the patterned photoresist 114. In some embodiments, the portion of the first conductive material 112 is disposed within the recess 102 and surrounded by the first insulating layer 103a.

Figure 11:
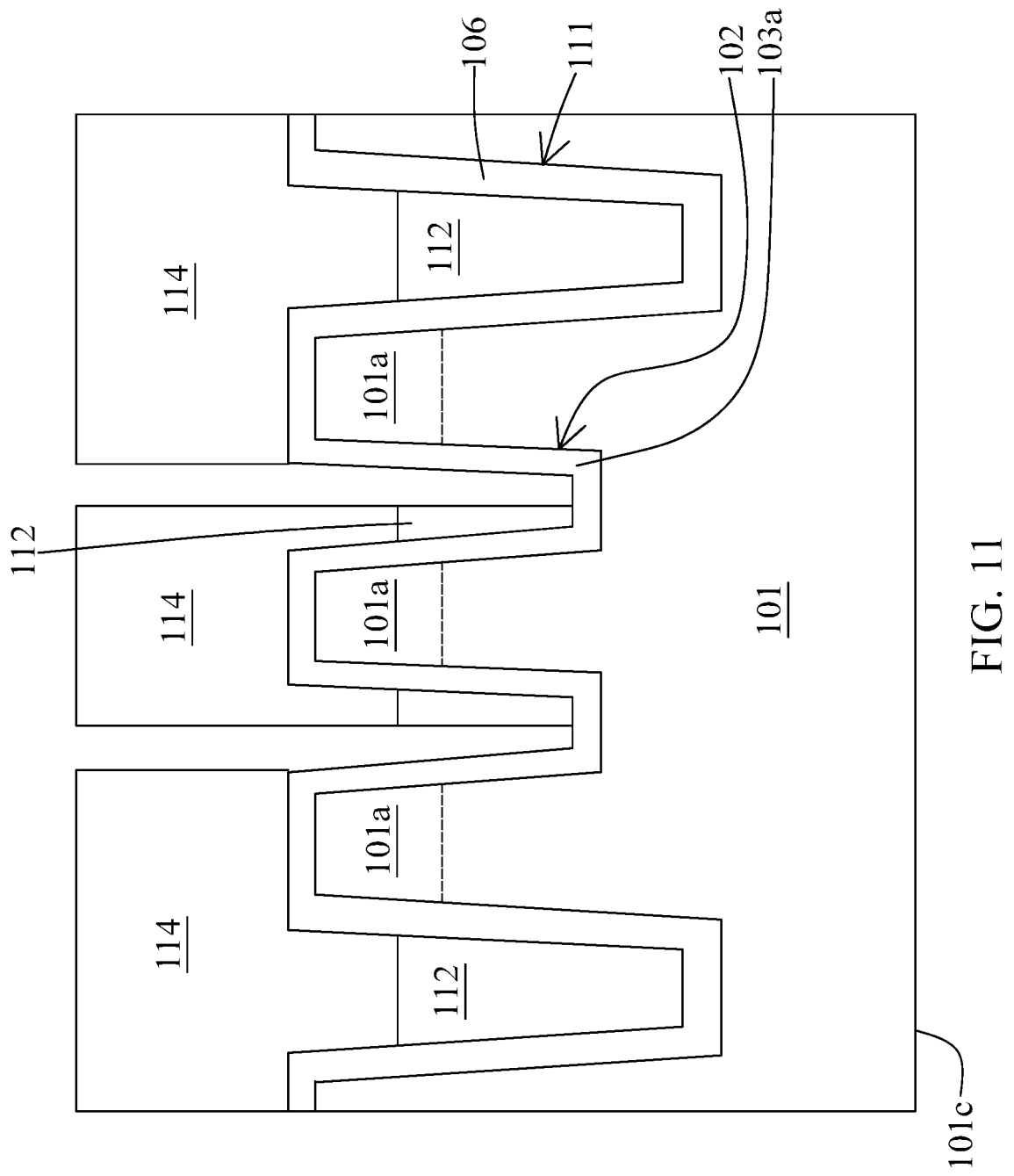

In some embodiments, the portion of the first conductive material 112 exposed through the patterned photoresist 114 is removed as shown in FIG. 11. In some embodiments, the portion of the first conductive material 112 exposed through the patterned photoresist 114 is removed by etching or any other suitable process.

Figure 12:
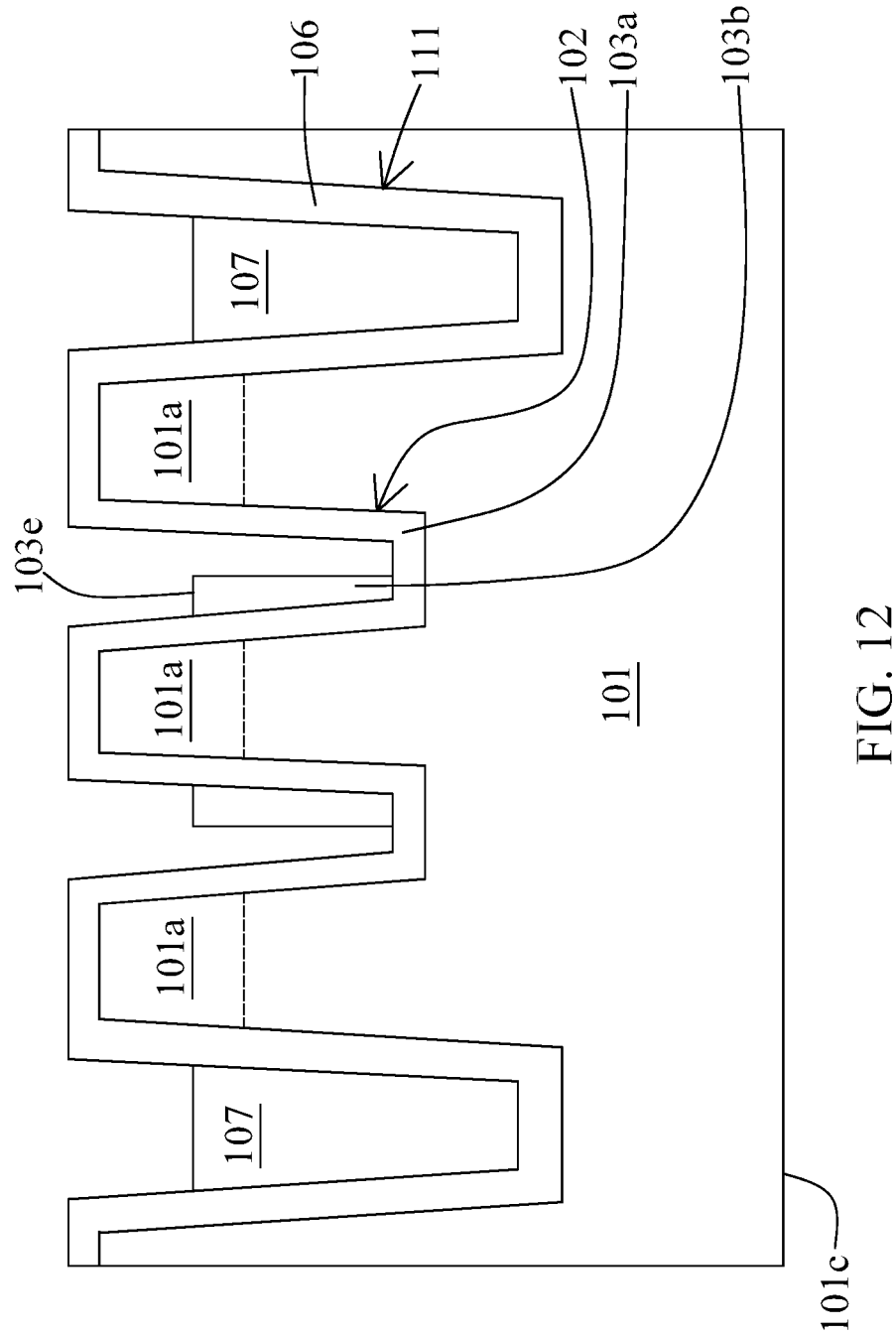

In some embodiments, after the removal of the portion of the first conductive material 112 exposed through the patterned photoresist 114, the patterned photoresist 114 is removed and the first conductive member 103b is formed as shown in FIG. 12. In some embodiments, a top surface 103e of the first conductive member 103b is formed. In some embodiments, the patterned photoresist 114 is removed by etching, stripping or any other suitable process.

In some embodiments, a third conductive member 107 is also formed within the trench 111 and surrounded by the isolation structure 106. In some embodiments, the first conductive member 103b and the third conductive member 107 are formed simultaneously or separately.

Figure 13:
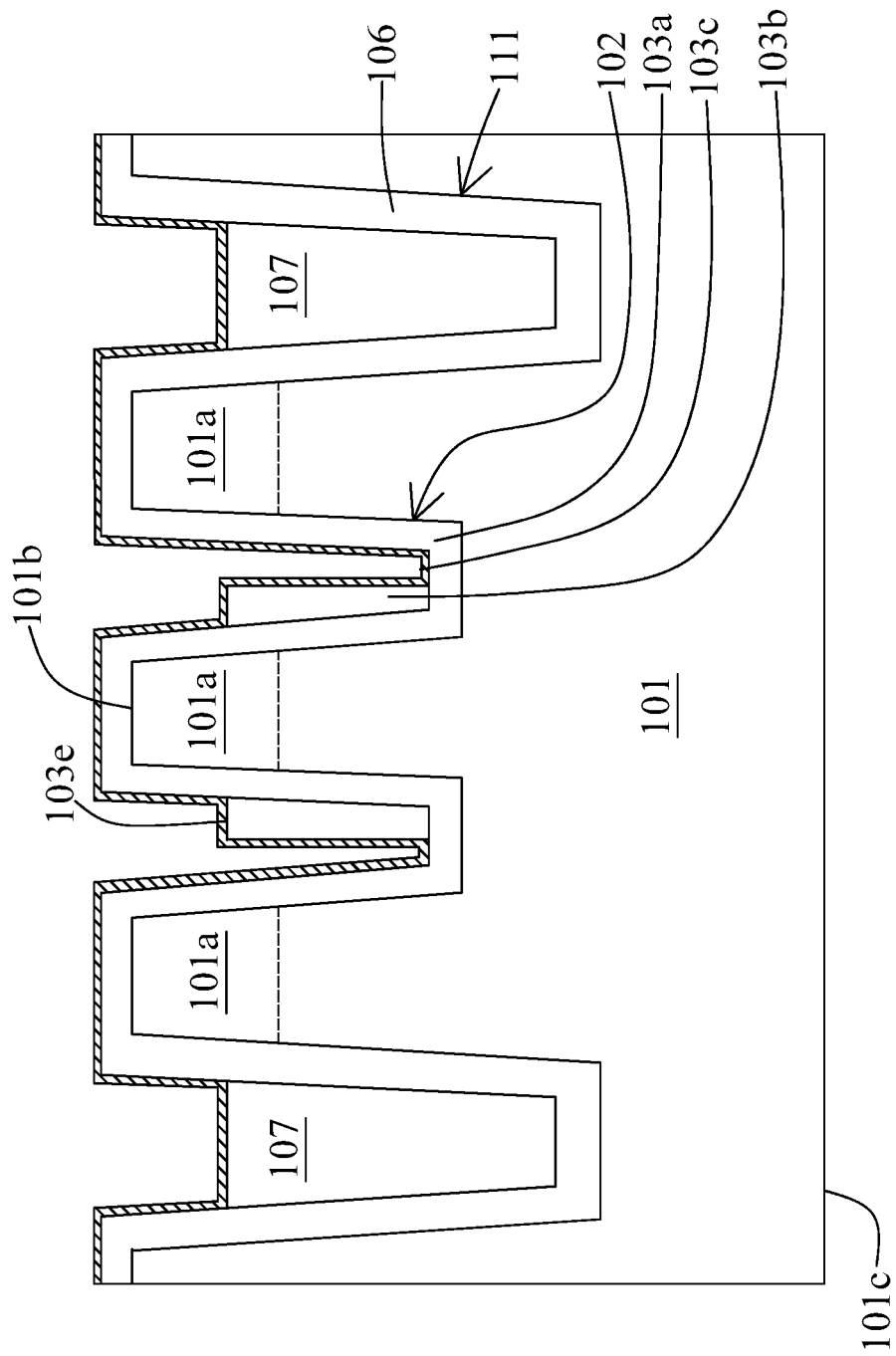

Referring to FIG. 13, a second insulating layer 103c is disposed within the recess 102 and conformal to the first insulating layer 103a and the first conductive member 103b according to step S206 in FIG. 2. In some embodiments, the second insulating layer 103c covers the first conductive member 103b and the third conductive member 107. In some embodiments, the second insulating layer 103c is also disposed over the first surface 101b of the semiconductor substrate 101.

In some embodiments, the first conductive member 103b is enclosed by the second insulating layer 103c and the first insulating layer 103a. In some embodiments, the second insulating layer 103c includes dielectric material such as oxide. In some embodiments, the second insulating layer 103c is formed by deposition, atomic layer deposition (ALD) or any other suitable process.

Figure 14:
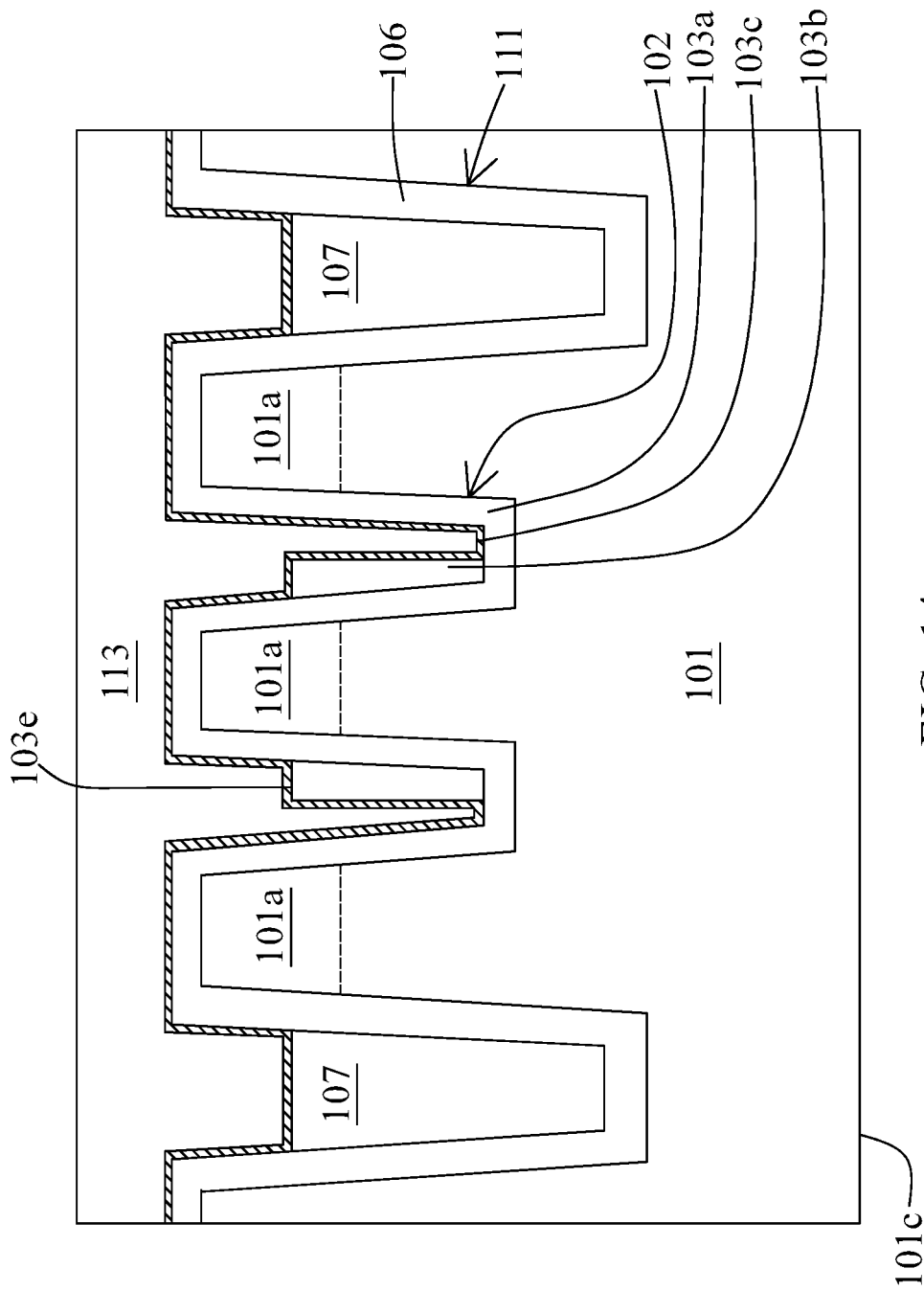
Figure 15:
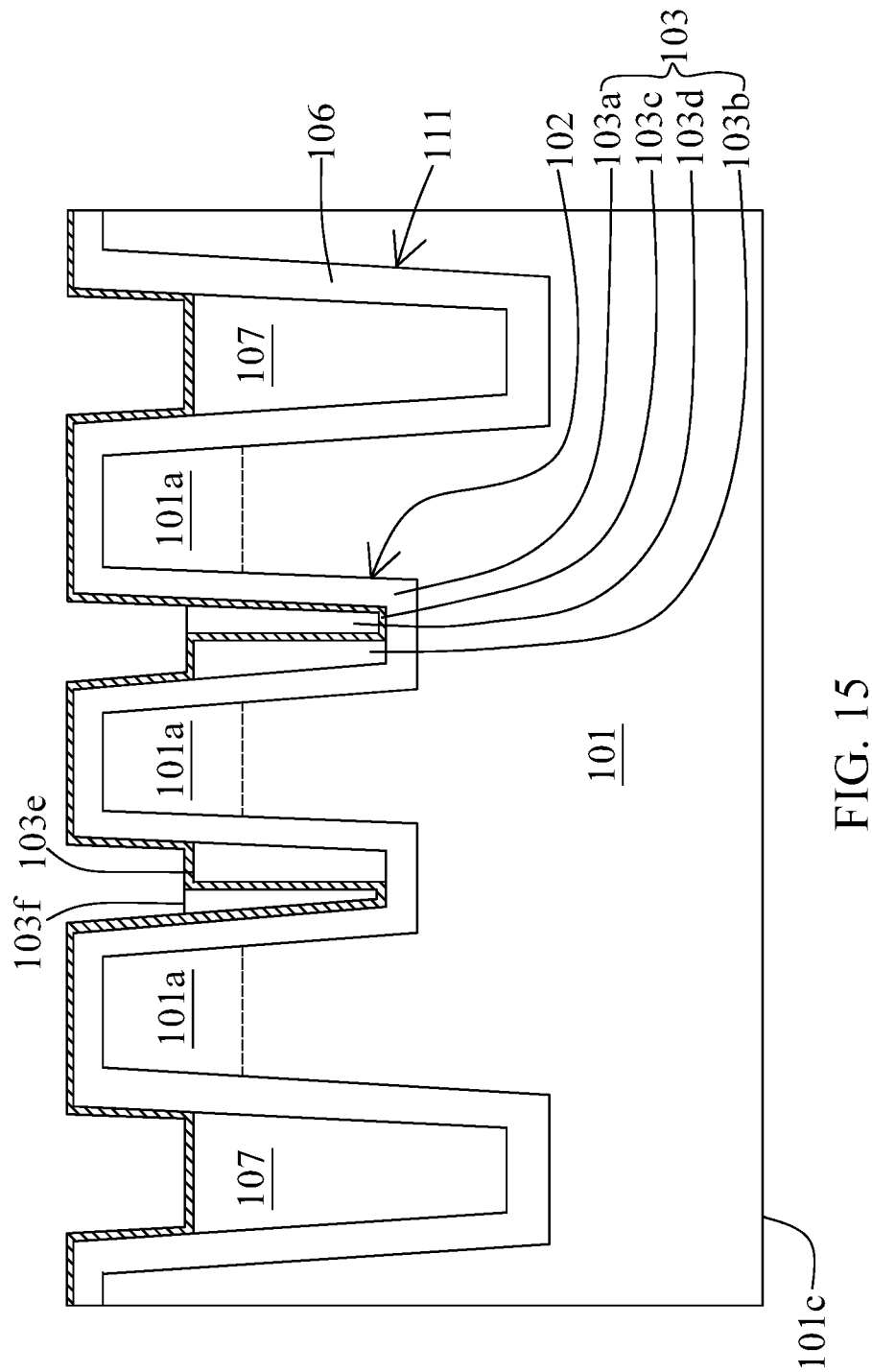

Referring to FIGS. 14 and 15, a second conductive material 113 is disposed within the recess 102 and surrounded by the second insulating layer 103c to form a second conductive member 103d adjacent to the first conductive member 103b according to step S207 in FIG. 2. In some embodiments, the second conductive material 113 is disposed over the second insulating layer 103c as shown in FIG. 14. In some embodiments, the second conductive material 113 is disposed by deposition, chemical vapor deposition (CVD) or any other suitable process.

In some embodiments, the disposing of the second insulating layer 103c is performed prior to the disposing of the second conductive material 113. In some embodiments, the disposing of the first conductive material 112 is performed prior to the disposing of the second conductive material 113. In some embodiments, the disposing of the first conductive material 112 and the disposing of the second conductive material 113 are performed separately.

In some embodiments, some portions of the second conductive material 113 are removed to form the second conductive member 103d as shown in FIG. 15. In some embodiments, some portions of the second conductive material 113 are removed by etching or any other suitable process. In some embodiments, a portion of the second conductive material 113 disposed above the first conductive member 103b is removed to form the second conductive member 103d.

In some embodiments, a portion of the second conductive material 113 above the third conductive member 107 is removed. In some embodiments, a portion of the second conductive material 113 is removed until a top surface 103*f* of the second conductive member 103*d* is substantially coplanar with a surface of a horizontal portion of the second insulating layer 103*c*.

In some embodiments, the top surface 103*e* of the first conductive member 103*b* is substantially lower than the top surface 103*f* of the second conductive member 103*d*. In some embodiments, the top surface 103*e* of the first conductive member 103*b* and the top surface 103*f* of the second conductive member 103*d* are surrounded by the active area 101*a* of the semiconductor substrate 101.

In some embodiments, the second conductive material 113 has a second work function substantially different from the first work function of the first conductive material 112. In some embodiments, the first work function of the first conductive material 112 is substantially greater than the second work function of the second conductive material 113. In some embodiments, the second work function of the second conductive material 113 is substantially less than 4 eV.

In some embodiments, a difference between the first work function of the first conductive material 112 and the second work function of the second conductive material 113 is substantially greater than 0.5 eV. In some embodiments, the second conductive material 113 is titanium nitride (TiN), tungsten (W) or the like. In some embodiments, the second conductive material 113 includes a material same as a material of the first conductive material 112.

Figure 16:
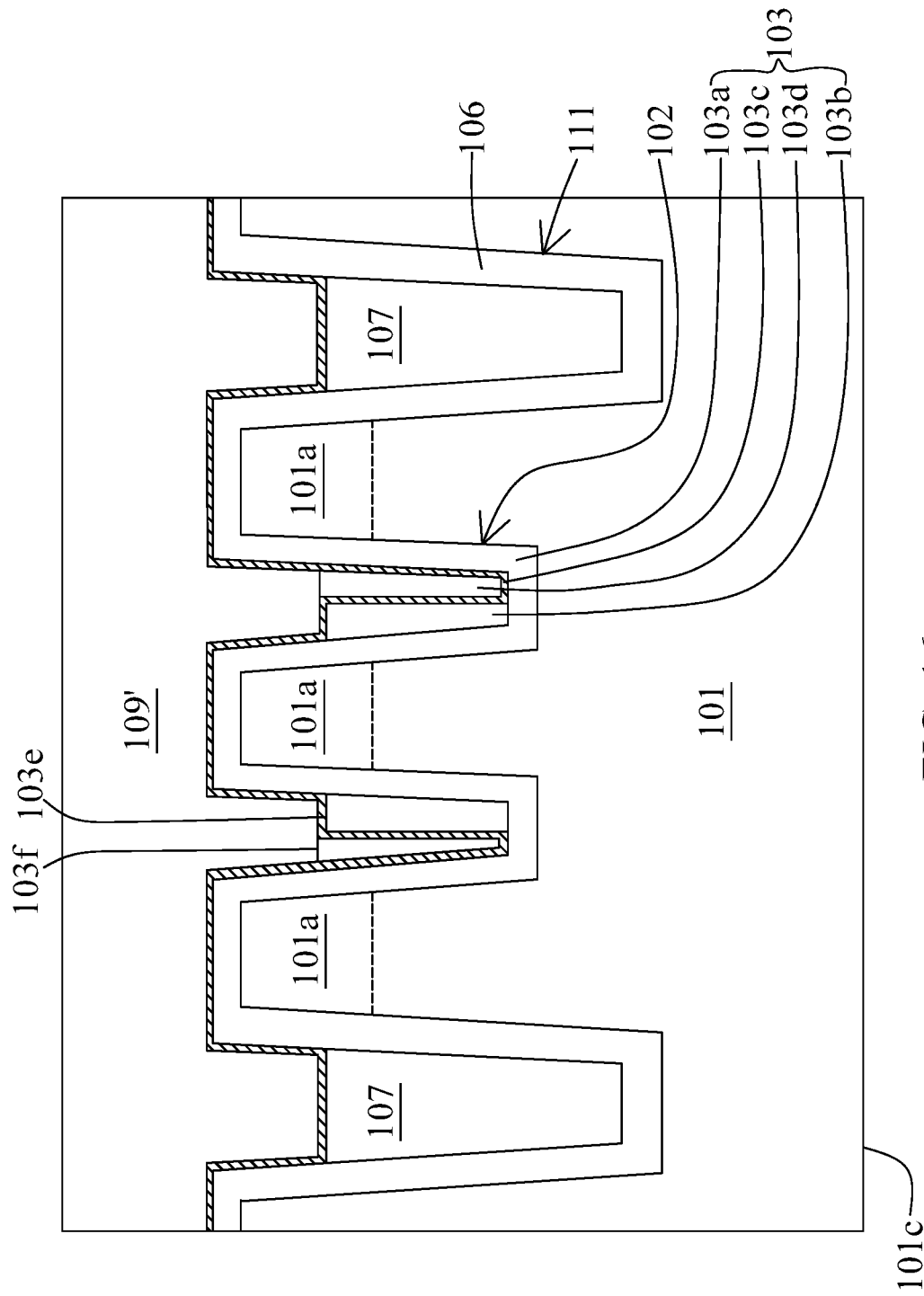

In some embodiments, after the formation of the second conductive member 103*d*, a dielectric material 109' is disposed over the second insulating layer 103*c* and the second conductive member 103*d* as shown in FIG. 16. In some embodiments, the dielectric material 109' is disposed by deposition, CVD or any other suitable process. In some embodiments, the dielectric material 109' is nitride or the like.

Figure 17:
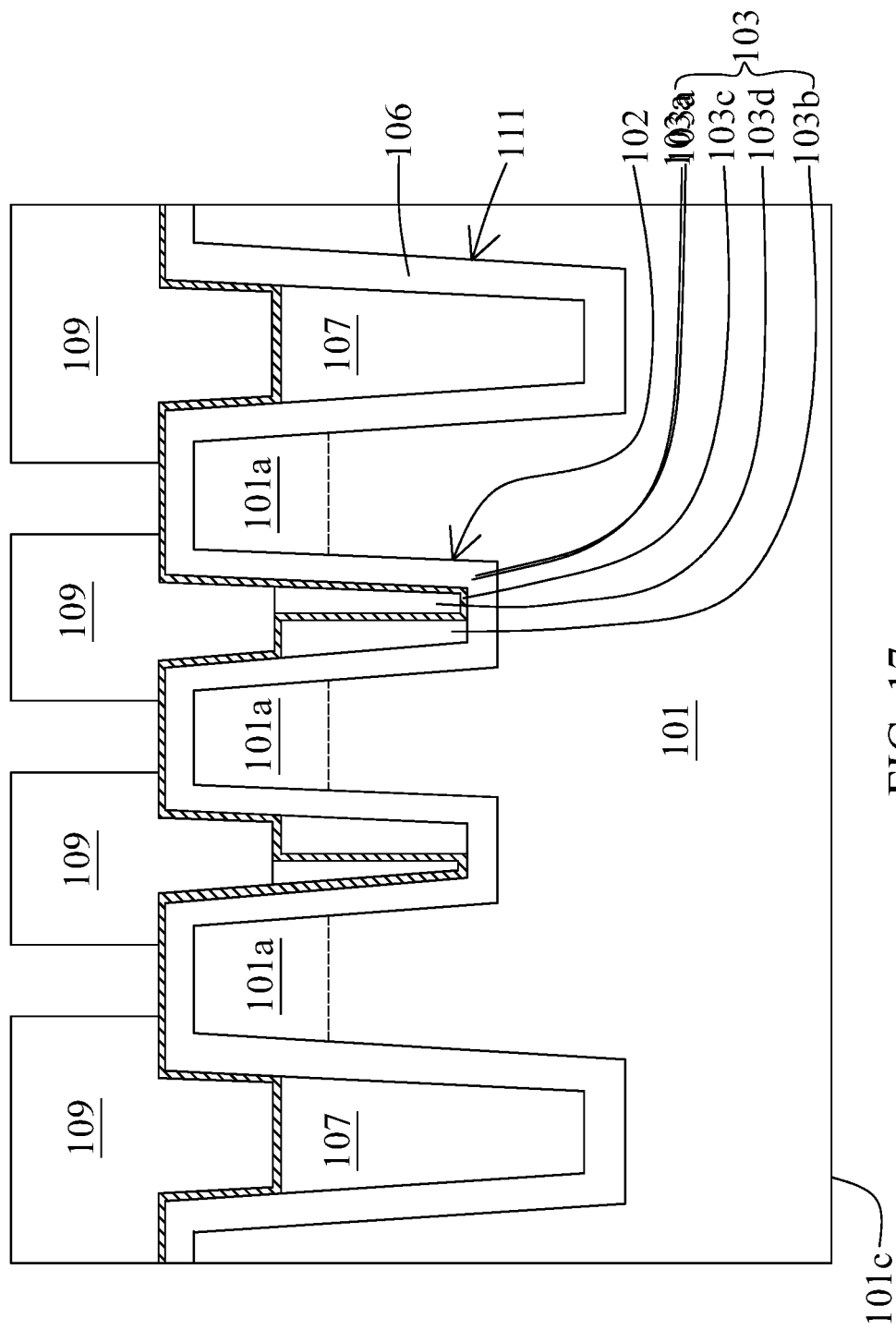

In some embodiments, after the disposing of the dielectric material 109', a portion of the dielectric material 109' is removed to form a dielectric layer 109 as shown in FIG. 17. In some embodiments, the portion of the dielectric material 109' is removed by etching or any other suitable process. In some embodiments, a portion of the second insulating layer 103*c* is exposed through the dielectric layer 109.

Figure 18:
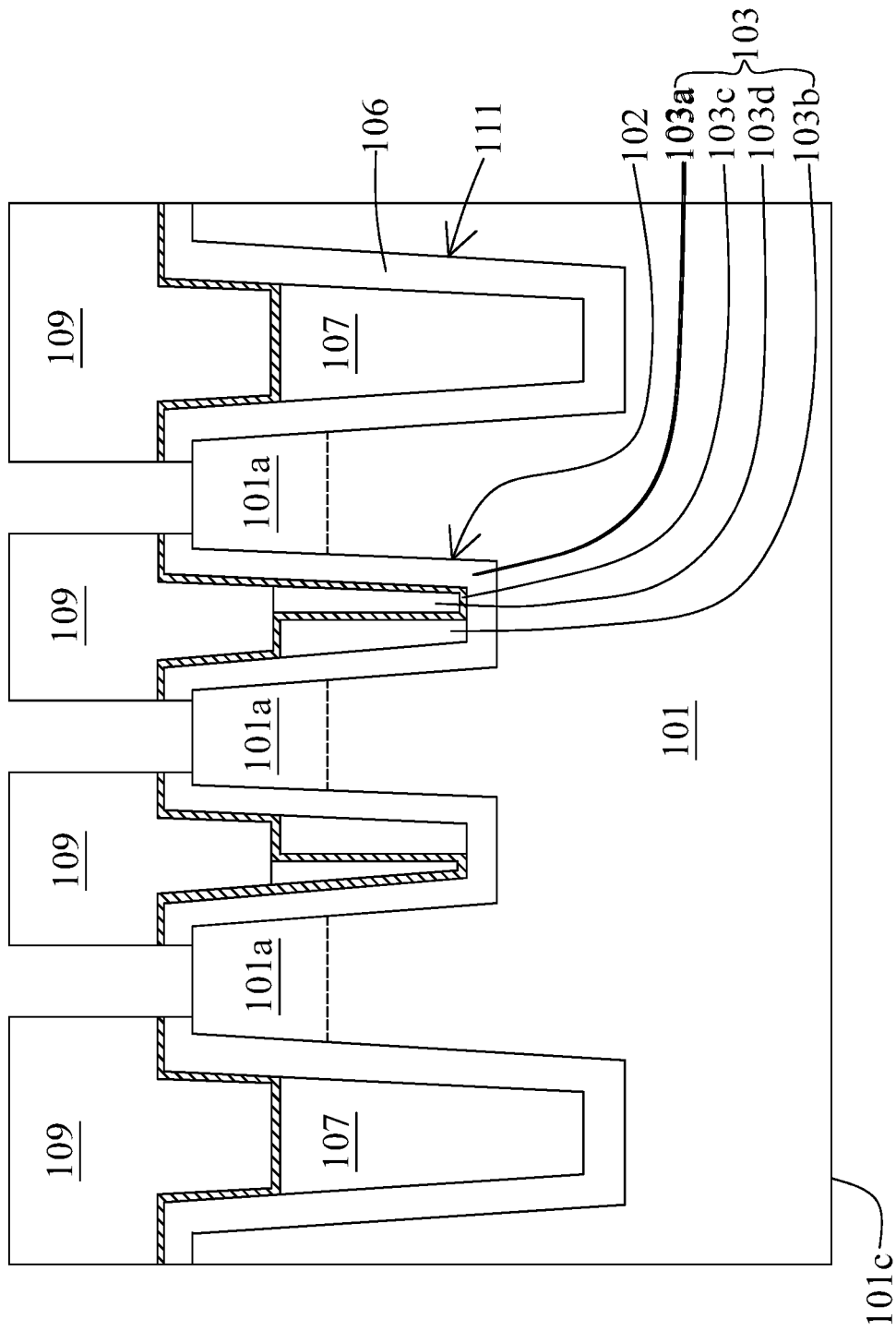
Figure 19:
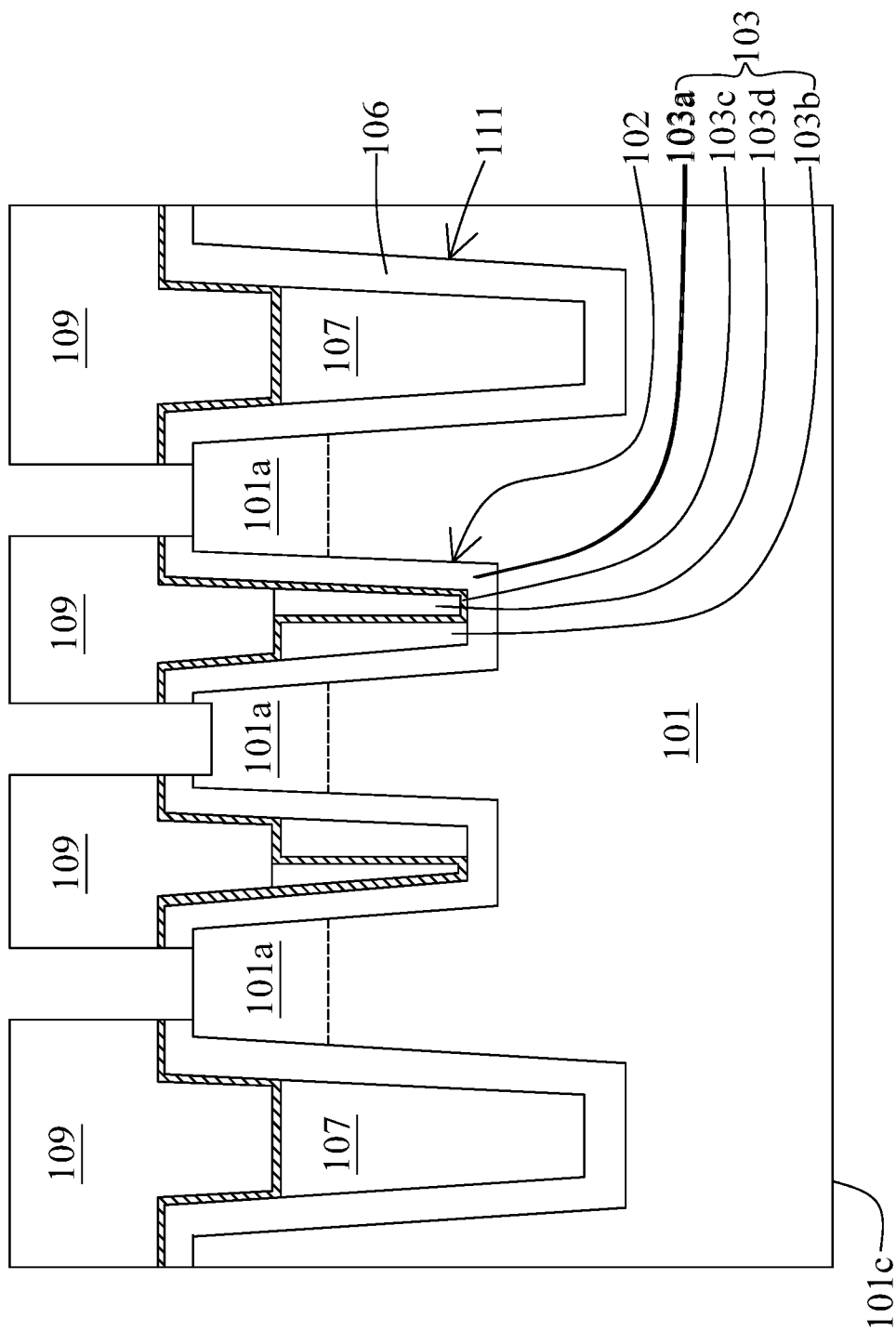

In some embodiments, the portion of the second insulating layer 103*c* exposed through the dielectric layer 109 is removed as shown in FIG. 18. In some embodiments, a portion of the first insulating layer 103*a* exposed through the dielectric layer 109 is also removed. In some embodiments, the removal of the portion of the second insulating layer 103*c* and the portion of the first insulating layer 103*a* exposed through the dielectric layer 109 is implemented by etching or any other suitable process. In some embodiments, a portion of the semiconductor substrate 101 exposed through the dielectric layer 109 is further removed as shown in FIG. 19.

Figure 20:
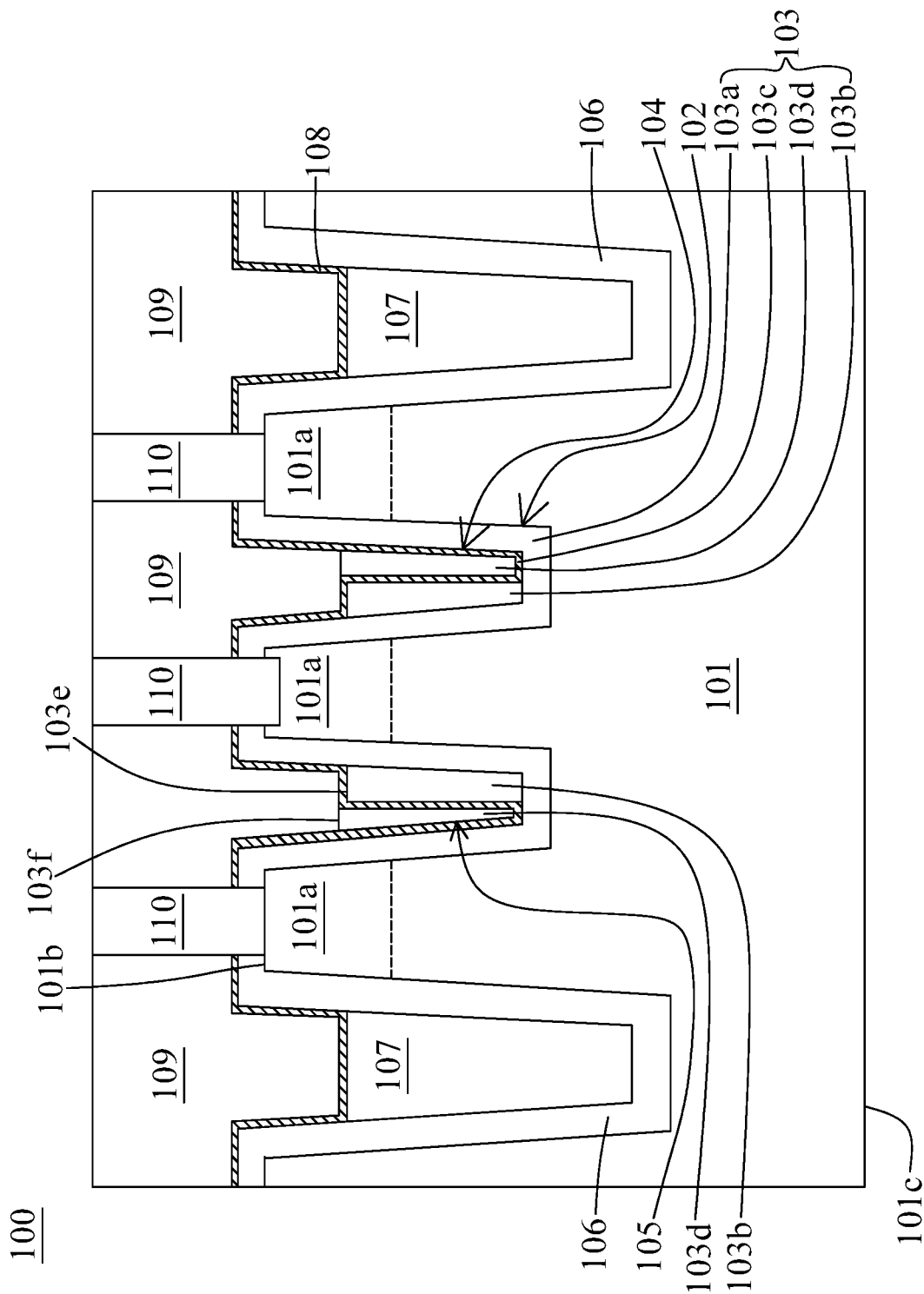

In some embodiments, after the removal of the portion of the first insulating layer 103*a* and the portion of the second insulating layer 103*c* exposed through the dielectric layer 109, a conductive plug 110 is formed over the active area 101*a* of the semiconductor substrate 101 as shown in FIG. 20. In some embodiments, the conductive plug 110 is formed by disposing a conductive material. In some embodiments, the conductive material is disposed by electroplating or any other suitable process.

In some embodiments, the conductive plug 110 extends through the dielectric layer 109 and connects to the active area 101*a* of the semiconductor substrate 101. In some embodiments, the conductive plug 110 is electrically connected to the word line 103 through the active area 101*a* of the semiconductor substrate 101. In some embodiments, the memory device 100 of FIG. 1 is formed as shown in FIG. 20.

In an aspect of the present disclosure, a memory device is provided. The memory device includes a semiconductor substrate with an active area defined adjacent to a surface of the semiconductor substrate, wherein the semiconductor substrate includes a recess extending from the surface into the semiconductor substrate; and a word line disposed within the recess, wherein the word line includes a first insulating layer disposed within and conformal to the recess, a first conductive member surrounded by the first insulating layer and disposed within the recess, a second insulating layer disposed conformal to the first insulating layer and the first conductive member, and a second conductive member disposed adjacent to the first conductive member and surrounded by the second insulating layer.

In another aspect of the present disclosure, a memory device is provided. The memory device includes a semiconductor substrate with an active area defined adjacent to a surface of the semiconductor substrate, wherein the semiconductor substrate includes a first recess extending from the surface into the semiconductor substrate; and a word line disposed within the first recess, wherein the word line includes a first insulating layer disposed conformal to the first recess and having a second recess within the first recess, a first conductive member surrounded by the first insulating layer and disposed within the second recess, a second insulating layer disposed conformal to the second recess and the first conductive member and having a third recess within the second recess, and a second conductive member disposed within the third recess.

In another aspect of the present disclosure, a method of manufacturing a memory device is provided. The method includes steps of providing a semiconductor substrate with an active area defined adjacent to a surface of the semiconductor substrate; forming a recess extending from the surface into the semiconductor substrate; disposing a first insulating layer conformal to the recess; disposing a first conductive material within the recess and surrounded by the first insulating layer; removing a portion of the first conductive material to form a first conductive member; disposing a second insulating layer within the recess and conformal to the first insulating layer and the first conductive member; and disposing a second conductive material within the recess and surrounded by the second insulating layer to form a second conductive member adjacent to the first conductive member.

In conclusion, because a word line includes dual conductive materials having different work functions, such difference can suppress or prevent a gate-induced drain leakage (GIDL). More specifically, because the word line includes a first conductive material with a high work function and a second conductive material with a low work function, such configuration can reduce the GIDL issue. Therefore, performance of the memory device and process of manufacturing of the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
    providing a semiconductor substrate with an active area defined adjacent to a surface of the semiconductor substrate;
    forming a first recess extending from the surface into the semiconductor substrate;
    disposing a first insulating layer conformal to the first recess, wherein the first insulating layer covers an entire sidewall of the first recess and forms a second recess surrounded by the first insulating layer;
    disposing a first conductive material within the second recess and surrounded by the first insulating layer;
    removing a portion of the first conductive material to form a first conductive member and to expose an upper surface of the first insulating layer in proximity to a bottom of the second recess;
    disposing a second insulating layer within the second recess and conformal to the first insulating layer and the first conductive member, wherein the second insulating layer is coupled to the upper surface of the first insulating layer in proximity to the bottom of the second recess; and
    disposing a second conductive material within the second recess and surrounded by the second insulating layer to form a second conductive member adjacent to the first conductive member,
    wherein the second conductive member is separated from the first insulating layer and the first conductive member by the second insulating layer.

2. The method according to claim 1, wherein a first work function of the first conductive material is substantially different from a second work function of the second conductive material.

3. The method according to claim 2, wherein the first work function of the first conductive material is substantially greater than the second work function of the second conductive material.

4. The method according to claim 1, wherein the first conductive material is the same as the second conductive material.

5. The method according to claim 1, further comprising disposing a patterned photoresist over the first insulating layer and the first conductive material, wherein the portion of the first conductive material exposed through the patterned photoresist is removed.

6. The method according to claim 5, further comprising removing the patterned photoresist after the formation of the first conductive member.

7. The method according to claim 1, wherein a portion of the second conductive material disposed above the first conductive member is removed to form the second conductive member.

8. The method according to claim 1, further comprising:
    disposing a dielectric layer over the first conductive member, the second conductive member and the second insulating layer; and
    forming a conductive plug extending through the dielectric layer and connecting to the active area of the semiconductor substrate.

9. The method according to claim 1, wherein the disposing of the second insulating layer is performed prior to the disposing of the second conductive material.

10. The method according to claim 1, wherein the disposing of the first conductive material is performed prior to the disposing of the second conductive material.

11. The method according to claim 1, wherein the disposing of the first conductive material and the disposing of the second conductive material are performed separately.

12. The method according to claim 2, wherein the first work function of the first conductive material is substantially greater than 4 eV, and the second work function of the second conductive material is substantially less than 4 eV.

13. The method according to claim 2, wherein a difference between the first work function and the second work function is substantially greater than 0.5 eV.

14. The method according to claim 1, wherein a top surface of the first conductive member is substantially lower than a top surface of the second conductive member.

15. The method according to claim 14, wherein the top surface of the first conductive member and the top surface of the second conductive member are surrounded by the active area of the semiconductor substrate.

16. The method according to claim 14, wherein a width of the top surface of the first conductive member is substantially greater than or equal to a width of the top surface of the second conductive member.

* * * * *